US012298670B2

(12) United States Patent
Paudel et al.

(10) Patent No.: US 12,298,670 B2
(45) Date of Patent: May 13, 2025

(54) APPARATUS FOR AND METHODS OF COMBINING MULTIPLE LASER BEAMS

(71) Applicant: Cymer, LLC, San Diego, CA (US)

(72) Inventors: Rabin Paudel, Portland, OR (US); Eric Anders Mason, San Diego, CA (US); Gamaralalage G. Padmabandu, San Diego, CA (US); John Theodore Melchior, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 264 days.

(21) Appl. No.: 17/779,362

(22) PCT Filed: Oct. 27, 2020

(86) PCT No.: PCT/US2020/057571
§ 371 (c)(1),
(2) Date: May 24, 2022

(87) PCT Pub. No.: WO2021/108054
PCT Pub. Date: Jun. 3, 2021

(65) Prior Publication Data
US 2023/0004091 A1 Jan. 5, 2023

Related U.S. Application Data

(60) Provisional application No. 62/941,971, filed on Nov. 29, 2019.

(51) Int. Cl.
*G03F 7/00* (2006.01)
*H01S 3/00* (2006.01)
(Continued)

(52) U.S. Cl.
CPC ........ *G03F 7/7005* (2013.01); *G03F 7/70025* (2013.01); *G03F 7/70041* (2013.01);
(Continued)

(58) Field of Classification Search
CPC .............. G03F 7/7005; G03F 7/70025; G03F 7/70041; G03F 7/708; H01S 3/0071; H01S 3/225; H01S 3/2391; H01S 3/005
See application file for complete search history.

(56) References Cited

U.S. PATENT DOCUMENTS 6,377,410 B1 4/2002 Wang et al.
6,463,083 B1 10/2002 Sumiyoshi et al.
(Continued)

FOREIGN PATENT DOCUMENTS

CN 103944069 A 7/2014
JP H02210889 A 8/1990
(Continued)

OTHER PUBLICATIONS

Office Action, counterpart Taiwanese Patent Application No. 111123803, mailed Mar. 3, 2023, 15 pages total (including English translation of 6 pages).
(Continued)

*Primary Examiner* — David P Porta
*Assistant Examiner* — Gisselle M Gutierrez
(74) *Attorney, Agent, or Firm* — DiBerardino McGovern IP Group LLC (57) ABSTRACT

Apparatus for and methods of combining multiple, i.e., two or more laser beams to reduce even to the point of elimination a transverse gap between the two or more beams caused, for example, by a space between a coating on a surface of the mirror and the edge of the mirror, or by optic geometry, is avoided.

12 Claims, 6 Drawing Sheets

(51) Int. Cl.
  *H01S 3/225* (2006.01)
  *H01S 3/23* (2006.01)
(52) U.S. Cl.
  CPC ............ *H01S 3/0071* (2013.01); *H01S 3/225* (2013.01); *H01S 3/2391* (2013.01)

(56) References Cited

U.S. PATENT DOCUMENTS

| | | |
|---|---|---|
| 2003/0219094 A1 | 11/2003 | Basting et al. |
| 2004/0252743 A1 | 12/2004 | Anikitchev et al. |
| 2006/0140232 A1 | 6/2006 | Hergenhan et al. |
| 2006/0274434 A1 | 12/2006 | Mino et al. |
| 2007/0127123 A1 | 6/2007 | Brown et al. |
| 2011/0216417 A1 | 9/2011 | Chann et al. |
| 2013/0100974 A1 | 4/2013 | Janssens et al. |
| 2013/0162956 A1 | 6/2013 | Okuda |
| 2015/0236479 A1 | 8/2015 | Seki |
| 2016/0344162 A1 | 11/2016 | Konno et al. |
| 2017/0063025 A1 | 3/2017 | Wakabayashi et al. |
| 2017/0093119 A1 | 3/2017 | Suzuki et al. |
| 2017/0302050 A1 | 10/2017 | Kakizaki et al. |
| 2017/0311429 A1 | 10/2017 | Rafac et al. |
| 2020/0395733 A1 | 12/2020 | Kyoto |
| 2022/0303440 A1* | 9/2022 | Song ..................... G01J 3/0235 |

FOREIGN PATENT DOCUMENTS

| | | | | |
|---|---|---|---|---|
| JP | H05297318 A | 11/1993 | | |
| JP | 2000091678 A | 3/2000 | | |
| JP | 2002140829 A | 5/2002 | | |
| JP | 2005142306 A | 6/2005 | | |
| JP | 2006093586 A | 4/2006 | | |
| JP | 2006235591 A | 9/2006 | | |
| JP | 2007017925 A | 1/2007 | | |
| JP | 2013521667 A | 6/2013 | | |
| JP | 2013130692 A | 7/2013 | | |
| JP | 2015153889 A | 8/2015 | | |
| JP | 7395729 B2 * | 12/2023 | ........... | G03F 7/7005 |
| TW | 201803412 A | 1/2018 | | |
| TW | I838777 B * | 4/2024 | ......... | G03F 7/70025 |
| WO | 2015115301 A1 | 3/2017 | | |
| WO | 2015194029 A1 | 4/2017 | | |
| WO | 2015194056 A1 | 4/2017 | | |
| WO | 2016006099 A1 | 4/2017 | | |
| WO | 2019163069 A1 | 8/2019 | | |

OTHER PUBLICATIONS

Klaus Eisner, European International Searching Authority, International Search Report and Written Opinion, counterpart PCT Application No. PCT/US2020/057571, mailed Feb. 26, 2021, 14 pages total.

Office Action, counterpart Japanese Patent Application No. 2022-525873, mailed Jul. 21, 2023, 12 pages total (including English translation of 7 pages).

\* cited by examiner

APPARATUS FOR AND METHODS OF COMBINING MULTIPLE LASER BEAMS

CROSS REFERENCE TO RELATED APPLICATION

This application claims priority to U.S. Application No. 62/941,971, filed Nov. 29, 2019 and titled APPARATUS FOR AND METHODS OF COMBINING MULTIPLE LASER BEAMS, which is incorporated herein in its entirety by reference.

FIELD

The present disclosure relates combining multiple laser beams for use, for example, in a lithographic apparatus.

BACKGROUND

A lithographic apparatus applies a desired pattern onto a substrate such as a wafer of semiconductor material, usually onto a target portion of the substrate. A patterning device, which is alternatively referred to as a mask or a reticle, may be used to generate a circuit pattern to be formed on an individual layer of the wafer. Transfer of the pattern is typically accomplished by imaging onto a layer of radiation-sensitive material (resist) provided on the substrate. In general, a single substrate will contain adjacent target portions that are successively patterned.

Lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate. Herein, for the sake of simplicity, both steppers and scanners will be referred to simply as scanners.

The light source used to illuminate the pattern and project it onto the substrate can be of any one of a number of configurations. Deep ultraviolet excimer lasers commonly used in lithography systems include the krypton fluoride (KrF) laser at 248 nm wavelength and the argon fluoride (ArF) laser at 193 nm wavelength.

There may be instances where it is desired to use multiple, for example two, laser beams. As an example, it may be desirable to have the capability of changing wavelength between pulses. In another instance, it may be desirable to increase the power and/or repetition rate of the laser system by combining two laser beams so they deliver power simultaneously or on alternating pulses. Here and elsewhere, "combining" is used to connote causing the beams to propagate in a common direction either collinearly or parallel to one another In other words, wafer throughputs can be increased if the need for additional exposure passes can be avoided. It would also be beneficial to be able to increase the amount of power (dose) delivered to the wafer past the limits of what a single laser can provide. This can theoretically be accomplished by using two lasers with overlaid beams feeding the scanner, thus permitting multiple wavelength exposure to be accomplished in a single pass. Combining each KrF laser at a maximum power, higher total power could be achieved.

SUMMARY

The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments. Its sole purpose is to present some concepts of one or more embodiments in a simplified form as a prelude to the more detailed description that is presented later.

According to one aspect of an embodiment there is disclosed a gas discharge laser system comprising a first laser chamber module adapted to generate a first beam of laser radiation, a second laser chamber module adapted to generate a second beam of laser radiation, and a beam combiner arranged to receive the first beam and the second beam and adapted to propagate the first beam and the second beam in a common direction, the beam combiner comprising a mirror having a reflective surface and a beveled edge forming an acute angle with the beveled edge, the mirror being arranged such that the first beam of laser radiation reflects off of the reflective surface in the common direction and the second beam of laser radiation propagates in the common direction immediately adjacent to the acute angle. The system may further comprise an aperture arranged such that the second beam passes through the aperture and the aperture limits a dimensional extent of the second beam of laser radiation so that the second beam of laser radiation does not impinge on the acute angle. The width of the aperture may be adjustable.

According to another aspect of an embodiment there is disclosed a gas discharge laser system comprising a first laser chamber module adapted to generate a first beam of laser radiation, a second laser chamber module adapted to generate a second beam of laser radiation, and a beam combiner arranged to receive the first beam and the second beam and adapted to propagate the first beam and the second beam in a common direction, the beam combiner comprising an optical element having a face having a first portion having a reflective coating and a second portion having no reflective coating, the optical element being arranged such that such that the first beam of laser radiation reflects off of the reflective surface in the common direction and the second beam of laser radiation passes through the optical element and the second portion of face of the optical element in the common direction.

According to another aspect of an embodiment there is disclosed a gas discharge laser system comprising a first laser chamber module adapted to generate a first beam of laser radiation, a second laser chamber module adapted to generate a second beam of laser radiation, and a beam combiner arranged to receive the first beam and the second beam and adapted to propagate the first beam and the second beam in a common direction, the beam combiner comprising a mirror and an actuator mechanically coupled to the mirror, the first beam of laser radiation initially travelling in a first direction and striking the mirror at a first location and the second beam of laser radiation initially travelling in a second direction at an angle to the first direction and striking the mirror at the first location, the actuator being arranged to rotate the mirror between a first position in which the first beam of laser radiation propagates in third direction and a second position in which the second beam of laser radiation propagates in the third direction. The first direction may be at an angle θ to the second direction in which case the actuator is adapted to rotate the mirror by the angle θ/2. The first laser chamber module may be adapted to generate a first pulsed beam of laser radiation and the second laser chamber module may adapted to generate a second pulsed beam of laser radiation between pulses of the first pulsed beam of laser radiation and the actuator may be adapted to place the mirror in the first position during a pulse of the first pulsed beam of laser radiation and to place the mirror in the second position during a pulse of the second pulsed beam of laser radiation.

According to another aspect of an embodiment there is disclosed a method of combining a first pulsed laser beam and a second pulsed laser beam in a lithography apparatus, the method comprising the steps of placing a mirror in a first state in which a pulse of the first pulsed laser beam striking the mirror is reflected in a direction permitting use of the pulse, generating one or more pulses of the first beam of laser radiation, placing the mirror in a second state in which a pulse of the second pulsed laser beam striking the mirror is reflected in a direction permitting use of the pulse, and generating one or more pulses of the second beam of laser radiation. The method the step of placing the mirror in a first state in which a pulse of the first pulsed laser beam will propagate in a direction permitting use of the pulse may comprise placing the mirror in a first rotational position and the step of placing the mirror in a second state in which a pulse of the second pulsed laser beam will propagate in a direction permitting use of the pulse may comprise placing the mirror in a second rotational position. The first pulsed laser beam and the second pulsed laser beam may strike the mirror at an angle θ with respect to one another and the first rotational position and the second rotational position may be at an angle θ with respect to one another.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate the present invention and, together with the description, further serve to explain the principles of the present invention and to enable a person skilled in the relevant art(s) to make and use the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Figure 1:
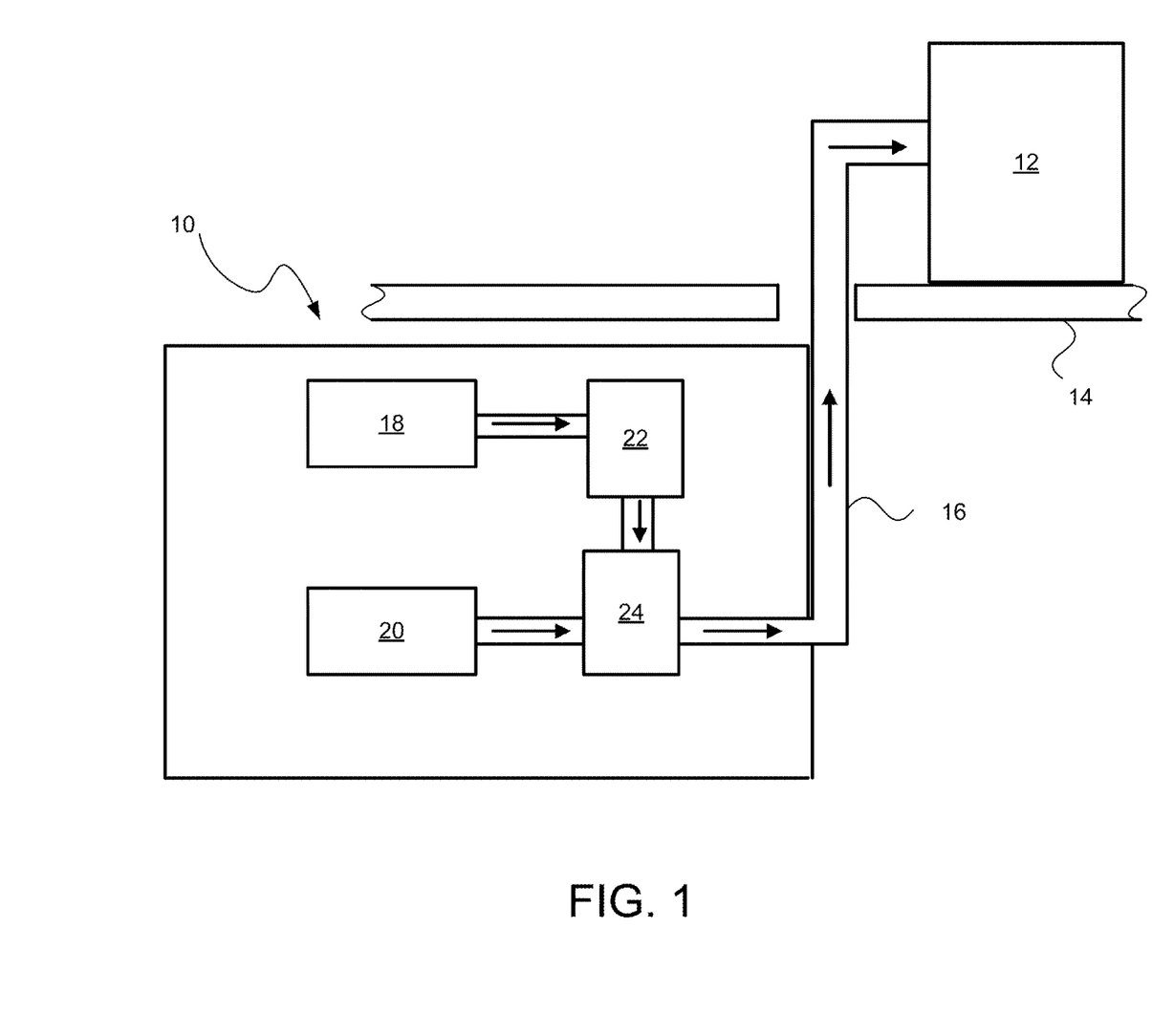
FIG. 1 is a functional block diagram of a conventional two-chamber laser system.

Before describing embodiments in more detail, it is instructive to present an example environment in which embodiments of the present invention may be implemented. FIG. 1 is a functional block diagram of a conventional two-chamber laser system 10. In this embodiment a laser beam is provided at the input port of a lithography machine 12 such as a stepper or scanner machine. The main components of the laser system 10 may be installed below the floor 14 on which the scanner 12 is installed as shown. The laser system 10 includes a beam delivery unit 16, which provides an enclosed beam path for delivering the laser beam to the input port of scanner 12. The particular light source system illustrated includes a master oscillator 18 and a power amplifier 20 and is a type of laser system known as master oscillator power amplifier or MOPA system. The laser system 10 also includes various components for control of the spectral characteristics of the pulses, shaping the pulses, and so on which are generally indicated as optics 22 and optics 24. The master oscillator 18 produces a first laser beam which is amplified by two passes through the power amplifier 20 to produce an output laser beam as indicated by the arrows in FIG. 1. A single MOPA configuration as just described is merely an example. It will be apparent to one of ordinary skill in the art that the principles elucidated herein are also applicable to laser systems having other configurations such as MOMO, and multiple MOPA configurations.

Figure 2:
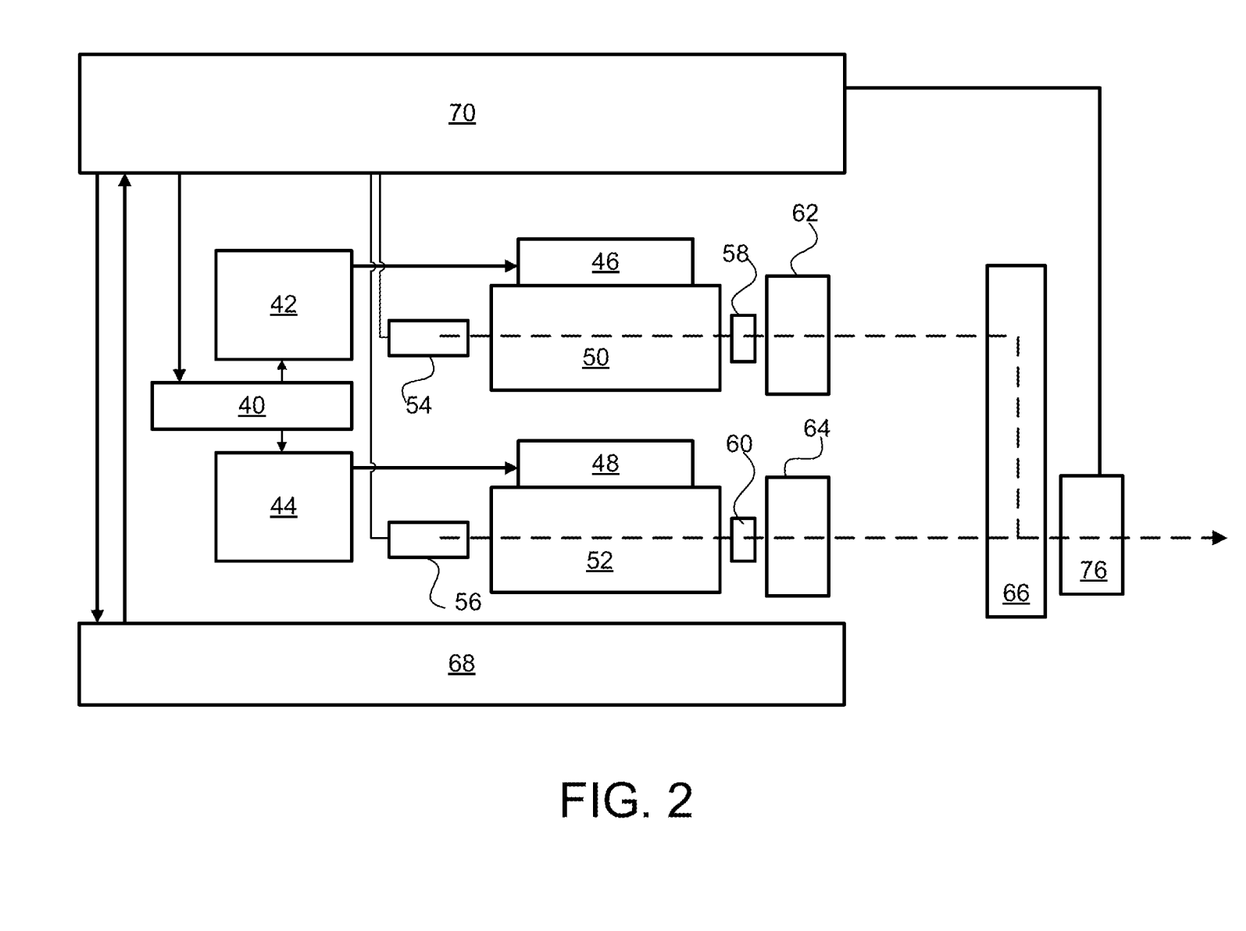
FIG. 2 is functional block diagram of a two chamber laser system according to an aspect of an embodiment.
Figure 3A:
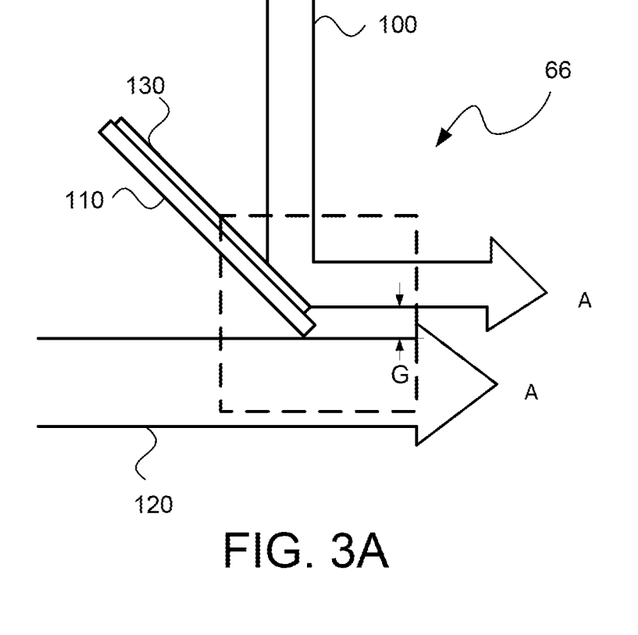
FIG. 3A is a diagram of an arrangement of a beam combiner using a pick-off mirror.

According to an aspect of an embodiment, the need to subject the wafer to multiple passes is avoided by exposing the wafer to two beams. In the arrangement shown in FIG. 2, a first resonant charger 40 supplies electrical energy to a first commutator 42 and a second commutator 44. The first commutator 42 supplies a pulse to the first compression head 46. The second commutator 44 supplies a pulse to a second compression head 48. The first compression head 46 causes a discharge in the first laser chamber module 50. The second compression head 48 causes a discharge in the second laser chamber module 52. Also shown in FIG. 3 are optics for conditioning the laser beams such as a first line narrowing module 54 and second line narrowing module 56, a first optical coupler 58 and a second optical coupler 60 and a first stabilization module 62 and a second stabilization module 64. The beams produced by the laser chamber modules are line narrowed to produce a bandwidth much smaller than the natural bandwidth of the gas discharge system. A control circuit 70 may control the first line narrowing module 54 and the second line narrowing module 56 so that the bandwidth and wavelength of the light beams generated by the first laser chamber module 50 and the second laser chamber module 52 may be different from one another.

Various triggering arrangements could be employed. For example, one trigger could be used to fire both chambers, with or without a delay between the time of the trigger and the discharge for either or both of the chambers. Alternatively, the triggers may be generated separately, that is, by separate circuitry so that the two chambers would have distinct voltage/energy commands.

Also generally indicated by 68 are various system components that can be used in common by the first laser chamber module 50 and the second laser chamber module 52 such as gas handling systems, control systems, interfaces, power distribution systems, cooling water systems, power for the chamber filters and blowers, and beam path purge systems. Thus, in the arrangement shown, the two laser chambers can share use of these components, and it is unnecessary to have two of each of them.

The arrangement of FIG. 2 also includes a control circuit 70 capable of operating two lasers with independent energy, controlling relative firing times, bandwidth, and wavelength, and a scanner interface capable of dividing energy/pulse commands between two lasers.

In one embodiment the first laser chamber module 50 may generate laser radiation at a first wavelength while the second laser chamber module 52 generates laser radiation at a second wavelength different from the first wavelength. Thus, in this case the two chambers cooperate to produce radiation at different wavelengths having different focal planes on the wafer and operating at different depths.

Also shown in FIG. 2 is a first metrology unit 72 arranged to measure parameters, including the wavelength, of the light beam generated by the first laser chamber module 50. The arrangement shown in FIG. 2 also includes a second metrology unit 74 arranged to measure parameters, including the wavelength, of the light beam generated by the second laser chamber module 52. A third metrology unit 76 is arranged to measure parameters, including the wavelength, of the combined beam, that is, parameters of the combination of the light beam from the first laser chamber module and the light beam from the second chamber module. It will be understood that there may be times when the combined beam is simply the beam from one of the laser chambers if the other chamber is not firing. The metrology units supply the results of their measurements to the control circuit 70. The metrology units as shown can measure the wavelength independently of the light from the two laser chamber modules and of the combined beam. The control unit 70 can use the measurements to control the wavelength of the light beam produced by each laser chamber module.

The firing of the two chambers can be interleaved to achieve an effective doubled repetition rate. The beams from the two lasers can be combined to achieve an effective repetition rate that is twice the repetition rate of either of the two lasers as shown in the bottom timing diagram. As mentioned, any one of a number of arrangements can be used to combine the beam paths of the multiple lasers.

The firing sequences of the two (or more) laser chamber modules can be set to any one of a variety of patterns. For example, the sequences can be set so that the chambers alternate firing shot-by-shot. Alternatively the sequences can be set so that the first laser chamber module fires for a first number of shots and then the second chamber fires for a second number of shots, where the first and second number may or may not be equal. These sequences can be adopted with laser chamber modules generating light of the same wavelength or of different wavelengths. Also, the laser chamber modules generating light at two different wavelengths can be fired at substantially different repetition rates to create a spectrum with different energy content in each of the two wavelength beams. The second discharge rate may, for example, be an integral multiple of the first discharge rate, so that the discharge rates may be, for example, in a ratio of 2:1. The relationship of the first and second discharge rates may also be a ratio of two integers such as 3:2.

For the foregoing embodiments a timing differential $\Delta t$ between the firing of the two lasers can essentially be set at any value including zero (assuming the optics can withstand a doubled instantaneous power level) or small enough that the two pulses occur not simultaneously but one immediately after the other (that is, during the same exposure) thus doubling effective dosing. Thus the beams from the two lasers can be generated one immediately after the other as shown to combined to achieve an effective dosing that is twice the dosing of either of the two lasers as shown in the bottom timing diagram.

The beam from the first laser chamber module 50 and the beam from the second laser chamber module 52 are combined by a beam combiner 66. Another way to combine the two beams, if they have different wavelengths, is to use a dichroic mirror. The dichroic mirror works in such a way that one wavelength (short-pass) gets transmitted and another wavelength gets reflected. This technology, however, works only to combine beams having differing wavelengths.

Figure 3B:
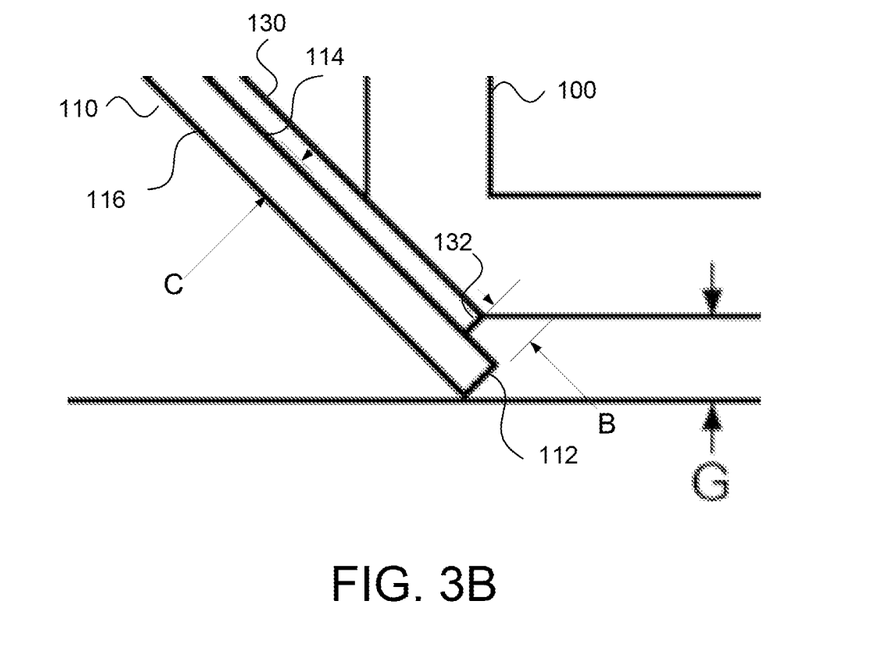
FIG. 3B is an enlarged portion of FIG. 3B.

A technology for combining two laser beams having the same or differing wavelength involves the use of a pick-off mirror. For example, in FIG. 3A, a beam 100 is reflected off of pick-off mirror 110 to go in a first direction A and a second beam 120 propagates close to the edge of the pick-off mirror 110 also in direction A. The direction A is taken as the direction in which the beam(s) propagate for further use. Because of manufacturing limitations in placing the reflective coating 130 on the face of the mirror 110 there is a space B (exaggerated in FIG. 3B which is an enlarged version of what is shown in the dashed box in FIG. 3A) between the edge 112 of the mirror 110 and the edge 132 of the coating 130. There is also a spacing C between coating 130 on top surface 114 of the mirror and back surface 116 of the mirror. The coating 130 is typically applied to within 1 mm from the edge of the mirror 110, i.e., distance B, and has a thickness of about 10 mm. The space B and thickness of the mirror 110, evidenced by spacing C, contribute to the thickness of a gap G between the two beams 110 and 120 having a width on the order of 10 mm. This gap G may cause problems in downstream optics, and it may desirable for some applications from an engineering standpoint to reduce the width of the gap G as much as possible.

Figure 4:
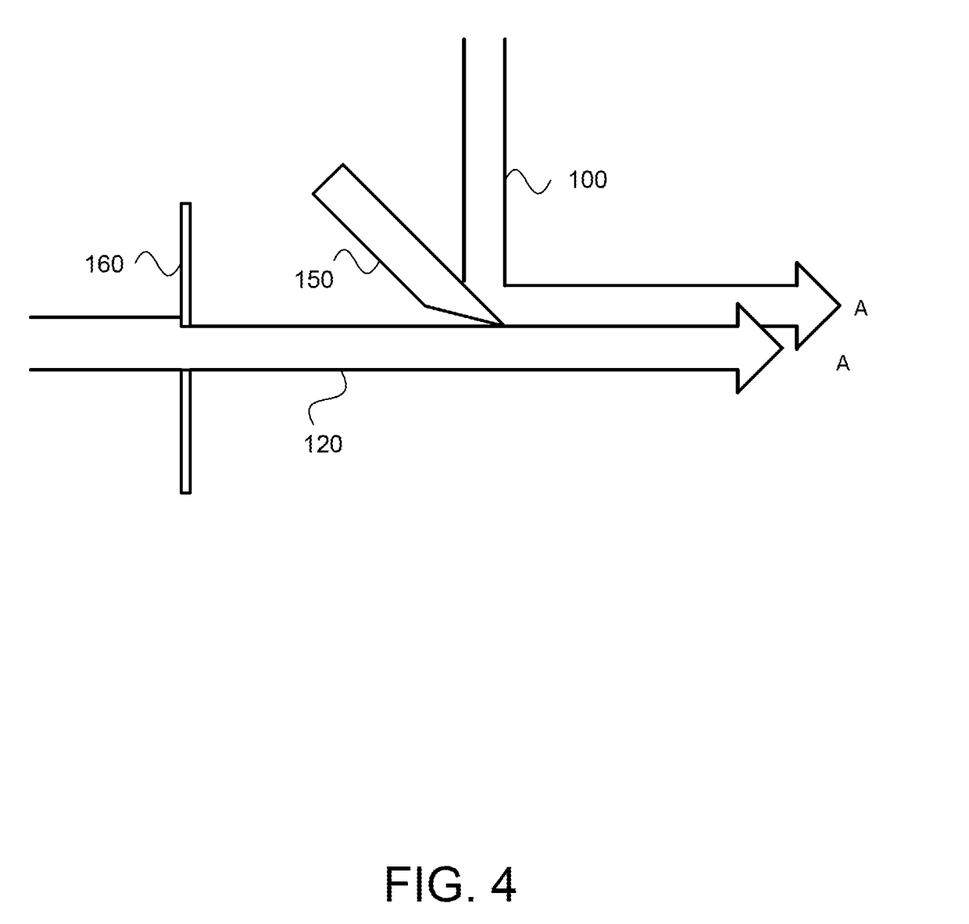
FIG. 4 is a diagram of a possible arrangement of a beam combiner according to an aspect of an embodiment.

To combine two beams 100 and 120 to minimize the gap between them an arrangement such as that shown in FIG. 4 may be used. In FIG. 4 a beveled mirror 150 is cut as shown in the figure to allow beam 120 to propagate without hitting any mirror surfaces. An adjustable aperture may be positioned and dimensioned to help ensure that beam 120 propagates without hitting any mirror surfaces. Beam 100 is reflected off beveled mirror 150 close to the edge of beveled mirror 160. The resulting combined beam profile has a reduced gap compared to the gap G, for example, on the order of about 1 mm. The beam 100 and the beam 120 are caused to propagate parallel to one another in the direction A, adjacent to one another and one translated with respect to the other in a direction transverse to the direction A.

Figure 5A:
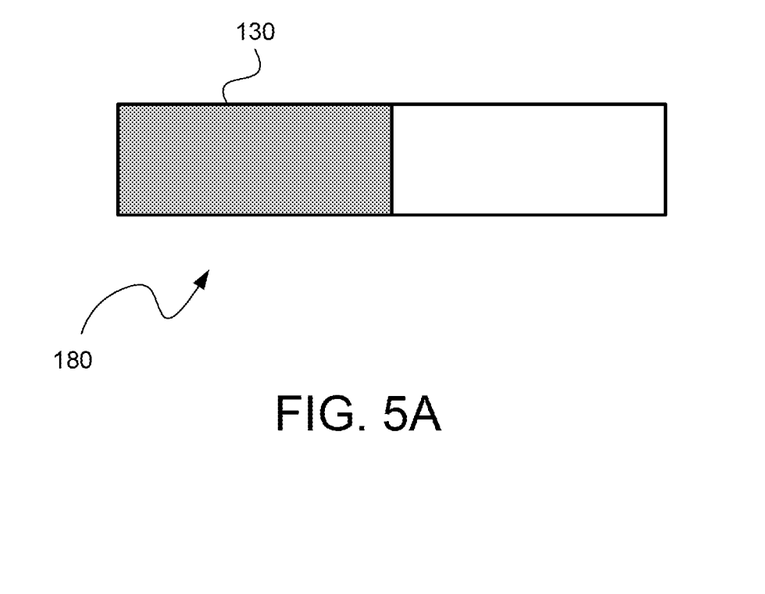
FIG. 5A is a plan view of an optical element to be used in a beam combiner according to an aspect of an embodiment and FIG. 5B is a diagram possible arrangement of a beam combiner incorporating the optical element of FIG. 5A according to an aspect of an embodiment.
Figure 5B:
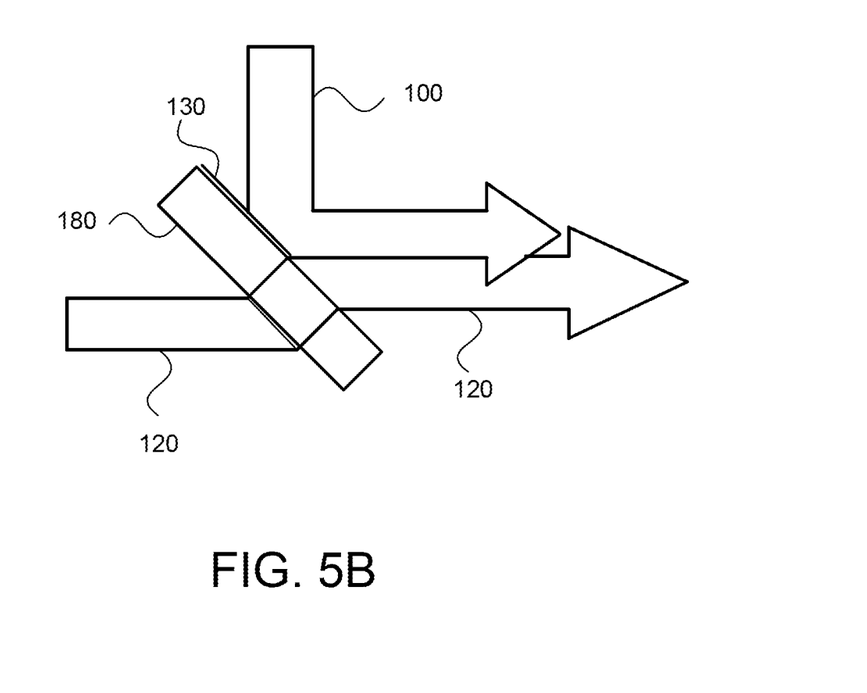

Another arrangement for combining two beams 100 and 120 to minimize the gap between them is shown in FIGS. 5A and 5B. As shown in in FIG. 5A a reflective coating 130 is applied on a portion, for example, a portion of a mirror 180 (independent of the mirror shape). As shown in FIG. 5B, laser beam 100 is reflected off of the reflective coating 130 while laser beam 120 propagates through the portion of mirror 180 having no coating. The two beams can be combined with a gap having a width that can be reduced essentially to zero.

Figure 6A:
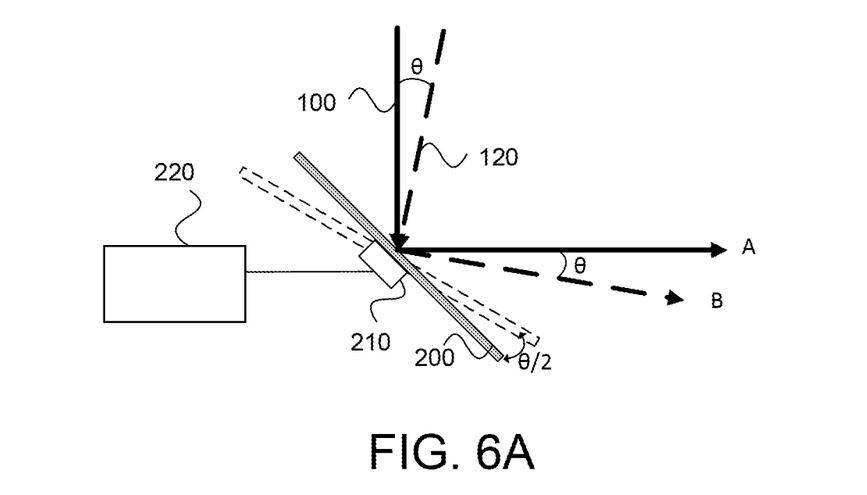
FIG. 6A is a plan view of a beam combiner according to an aspect of an embodiment in a first position and FIG. 6B is a plan view of the beam combiner of FIG. 6A in a second position.
Figure 6B:
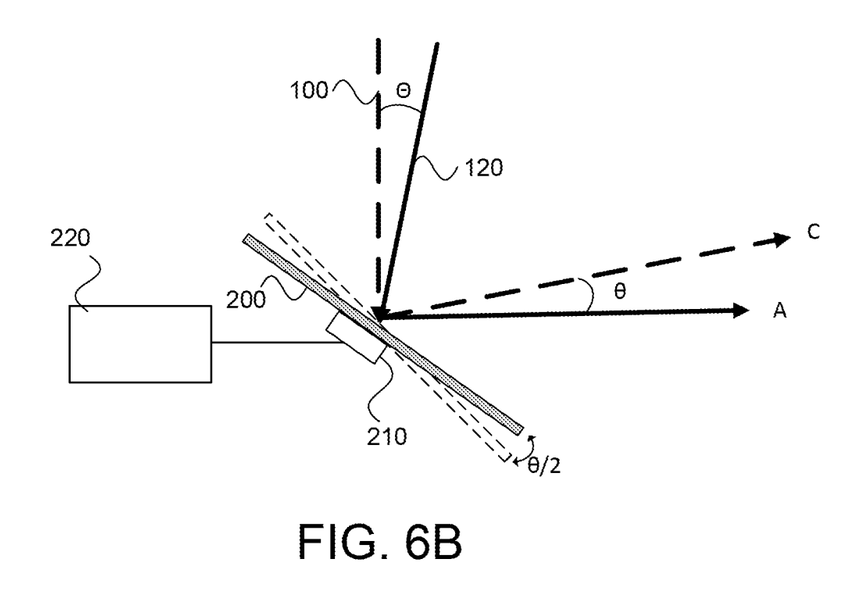

Another arrangement for combining two beams 100 and 120 to minimize the gap between them is shown in FIGS. 6A and 6B, such arrangement especially useful in systems in which beams 100 and 120 are not fired simultaneously, but rather in alternate pulses. Solid lines are active beams and dashed lines show the position of the mirrors and beams when they are in the other position The beams propagate in such a way that an angle between them is θ. The beams 100 and 120 strike a mirror 200 in a first position as shown in FIG. 6A in which the beam 100 propagates in a direction A, that is, the direction of use while the second beam 120 propagates in a direction B. Then as shown in FIG. 6B mirror 200 rotates by an amount θ/2 to a second position such that the beam 120 propagates in direction A while the beam 100 propagates in a direction C. The mirror 200 is rotated, that is, dithered, between the first position and the second position by an actuator 210 in accordance with a control signal applied by a controller 220. If beam 100 and beam 120 are fired as alternate pulses with a given repetition rate, and the mirror is dithered at the same repetition rate, then the beams can be propagated collinearly in direction A, essentially combining the two beams. The same effect can be achieved by keeping the mirror 200 stationary and dithering the propagation direction of one or both of beams 100 and 120.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Implementations of the disclosure may further be described using the following clauses:

1. A gas discharge laser system comprising:
a beam combiner arranged to receive a first beam of laser radiation and a second beam of laser radiation, and adapted to cause the first beam and the second beam to propagate in a common direction, the beam combiner comprising a mirror having a reflective surface and a beveled edge forming an acute angle with the reflective surface, the mirror being arranged such that the first beam of laser radiation reflects off of the reflective surface in the common direction and the second beam of laser radiation propagates in the common direction immediately adjacent to the acute angle.

2. The gas discharge laser system as in clause 1, further comprising a first laser chamber module adapted to generate the first beam of laser radiation and a second laser chamber module adapted to generate the second beam of laser radiation.

3. A gas discharge laser system as in clause 1 further comprising an aperture arranged such that the second beam passes through the aperture and the aperture limits a dimensional extent of the second beam of laser radiation so that the second beam of laser radiation does not impinge on the acute angle.

4. A gas discharge laser as in clause 3 wherein a width of the aperture is adjustable.

5. A gas discharge laser system as in clause 1 wherein the beam combiner is adapted to cause the first beam and the second beam propagate parallel to one another.

6. A gas discharge laser system as in clause 1 wherein the first beam of laser radiation has a first wavelength and the second beam of laser radiation has a second wavelength different from the first wavelength.

7. A gas discharge laser system as in clause 1 wherein the first beam of laser radiation is triggered to fire at a first time and the beam of laser radiation is triggered to fire at a second time wherein a difference between the first time and the second time is Δt.

8. A gas discharge laser system as in clause 7 wherein Δt is substantially equal to zero.

9. A gas discharge laser system as in clause 7 wherein Δt is selected such that first second of laser radiation is triggered immediately after the first beam of laser radiation stops firing.

10. A gas discharge laser system comprising:
a first laser chamber module adapted to generate a first beam of laser radiation; a second laser chamber module adapted to generate a second beam of laser radiation; and a beam combiner arranged to receive the first beam and the second beam and adapted to propagate the first beam and the second beam in a common direction, the beam combiner comprising an optical element having a face having a first portion having a reflective coating and a second portion having no reflective coating, the optical element being arranged such that such that the first beam of laser radiation reflects off of the reflective surface in the common direction and the second beam of laser radiation passes through the optical element and the second portion of face of the optical element in the common direction.

11. A gas discharge laser system as in clause 10 wherein the first beam of laser radiation has a first wavelength and the second beam of laser radiation has a second wavelength different from the first wavelength.

12. A gas discharge laser system as in clause 10 wherein the first beam of laser radiation is pulsed and triggered to fire at a first time and the beam of laser radiation is pulsed and triggered to fire at a second time wherein a difference between the first time and the second time is Δt.

13. A gas discharge laser system as in clause 12 wherein Δt is substantially equal to zero.

14. A gas discharge laser system as in clause 12 wherein Δt is selected such that first second of laser radiation is triggered immediately after the first beam of laser radiation stops firing.

15. A gas discharge laser system comprising:
   a first laser chamber module adapted to generate a first beam of laser radiation; a second laser chamber module adapted to generate a second beam of laser radiation; and a beam combiner arranged to receive the first beam and the second beam and adapted to propagate the first beam and the second beam in a common direction, the beam combiner comprising a mirror and an actuator mechanically coupled to the mirror, the first beam of laser radiation initially travelling in a first direction and striking the mirror at a first location and the second beam of laser radiation initially travelling in a second direction at an angle to the first direction and striking the mirror at the first location, the actuator being arranged to rotate the mirror between a first position in which the first beam of laser radiation propagates in third direction and a second position in which the second beam of laser radiation propagates in the third direction.

16. A gas discharge laser system as in clause 15 wherein the first direction is at an angle θ to the second direction and in which the actuator is adapted to rotate the mirror by the angle θ/2.

17. A gas discharge laser system as in clause 15 wherein the first laser chamber module is adapted to generate a first pulsed beam of laser radiation and the second laser chamber module is adapted to generate a second pulsed beam of laser radiation between pulses of the first pulsed beam of laser radiation and wherein the actuator is adapted to place the mirror in the first position during a pulse of the first pulsed beam of laser radiation and to place the mirror in the second position during a pulse of the second pulsed beam of laser radiation.

18. A method of combining a first pulsed laser beam and a second pulsed laser beam in a lithography apparatus, the method comprising the steps of:
   placing a mirror in a first state in which a pulse of the first pulsed laser beam striking the mirror is reflected in a direction permitting use of the pulse;
   generating one or more pulses of the first beam of laser radiation;
   placing the mirror in a second state in which a pulse of the second pulsed laser beam striking the mirror is reflected in a direction permitting use of the pulse; and
   generating one or more pulses of the second beam of laser radiation.

19. A method as in clause 18 wherein the step of placing the mirror in a first state in which a pulse of the first pulsed laser beam will propagate in a direction permitting use of the pulse comprises placing the mirror in a first rotational position and wherein the step of placing the mirror in a second state in which a pulse of the second pulsed laser beam will propagate in a direction permitting use of the pulse comprises placing the mirror in a second rotational position.

20. A method as in clause 18 wherein the first pulsed laser beam and the second pulsed laser beam strike the mirror at an angle θ with respect to one another and wherein the first rotational position and the second rotational position are at an angle θ with respect to one another.

21. A beam combiner arranged to receive a first beam and a second beam, and adapted to cause the first beam and the second beam to propagate the first beam in a common direction, the beam combiner comprising a mirror having a reflective surface and a beveled edge forming an acute angle with the reflective surface, the mirror being arranged such that the first beam of laser radiation reflects off of the reflective surface in the common direction and the second beam of laser radiation propagates in the common direction immediately adjacent to the acute angle.

22. The beam combiner as in clause 21, wherein the first beam is generated by a first laser chamber module and the second beam is generated by a second laser chamber module.

What is claimed is:

1. A gas discharge laser system comprising:
   a first laser chamber module adapted to generate a first beam of laser radiation;
   a second laser chamber module adapted to generate a second beam of laser radiation; and
   a beam combiner arranged to receive the first beam and the second beam and adapted to propagate the first beam and the second beam in a common direction, the beam combiner comprising a mirror and an actuator mechanically coupled to the mirror,
   the first beam of laser radiation initially travelling in a first direction and striking the mirror at a first location and the second beam of laser radiation initially travelling in a second direction at an angle to the first direction and striking the mirror at the first location,
   the actuator being arranged to rotate the mirror between a first position in which the mirror redirects the first beam of laser radiation to propagate in the common direction and a second position in which the mirror redirects the second beam of laser radiation to propagate in the common direction.

2. A gas discharge laser system as in claim 1 wherein the first direction is at an angle θ to the second direction and in which the actuator is adapted to rotate the mirror by an angle θ/2.

3. A gas discharge laser system as in claim 1 wherein the first laser chamber module is adapted to generate a first pulsed beam of laser radiation and the second laser chamber module is adapted to generate a second pulsed beam of laser radiation between pulses of the first pulsed beam of laser radiation and wherein the actuator is adapted to place the mirror in the first position during a pulse of the first pulsed beam of laser radiation and to place the mirror in the second position during a pulse of the second pulsed beam of laser radiation.

4. A gas discharge laser system comprising:
   a first laser chamber module adapted to generate a first beam of laser radiation;
   a second laser chamber module adapted to generate a second beam of laser radiation; and
   a mirror, wherein
   the mirror is configured to receive the first beam of laser radiation initially travelling in a first direction and striking the mirror at a first location and to receive the second beam of laser radiation initially travelling in a second direction at an angle to the first direction and striking the mirror at the first location, and the mirror has a first rotational orientation configured to reflect the first beam of laser radiation into a third direction and has a second rotational orientation configured to reflect the second beam of laser radiation into the third direction.

5. A gas discharge laser as in claim 4 further comprising an actuator mechanically coupled to the mirror and arranged to rotate the mirror between the first rotational orientation and the second rotational orientation.

6. A gas discharge laser system as in claim 4 wherein the first direction is at an angle θ with respect to the second direction and wherein the mirror in the second rotational orientation is rotated by the angle θ/2 from the first rotational orientation.

7. A gas discharge laser system as in claim 4 wherein the first laser chamber module is adapted to generate a first pulsed beam of laser radiation and the second laser chamber module is adapted to generate a second pulsed beam of laser radiation between pulses of the first pulsed beam of laser radiation and wherein the mirror is adapted to be in the first rotational orientation during a pulse of the first pulsed beam of laser radiation and the mirror is adapted to be in the second rotational orientation during a pulse of the second pulsed beam of laser radiation.

8. A laser system comprising:

a first source of laser radiation adapted to generate a first beam of laser radiation traveling along a first linear path;

a second source of laser radiation adapted to generate a second beam of laser radiation traveling along a second linear path; and a mirror capable of alternating between a first rotational orientation and a second rotational orientation, wherein the mirror is configured to receive the first beam when the mirror is in the first rotational orientation and is configured to receive the second beam when the mirror is in the second rotational orientation such that the first beam is reflected by the mirror to travel along a third linear path and the second beam is alternately reflected by the mirror to travel the linear third path.

9. A gas discharge laser as in claim 8 further comprising an actuator mechanically coupled to the mirror and arranged to dither the mirror between the first rotational orientation and the second rotational orientation.

10. A laser system as in claim 8 wherein the first linear path is at an angle θ with respect to the second linear path and wherein second rotational orientation is rotated by an angle θ/2 from the first rotational orientation.

11. A laser system as in claim 8 wherein the first source of laser radiation is adapted to generate a first pulsed beam of laser radiation and the second laser chamber source is adapted to generate a second pulsed beam of laser such that pulses of the first pulsed beam and pulses of the second pulsed beam alternately strike the mirror, and wherein the mirror is in the first rotational orientation when struck by pulses of the first pulsed beam of laser radiation and the mirror is in the second rotational orientation when struck by pulses of the second pulsed beam of laser radiation.

12. A gas discharge laser as in claim 11 further comprising an actuator mechanically coupled to the mirror and arranged to dither the mirror between the first rotational orientation and the second rotational orientation.

* * * * *